(12) United States Patent  
Yoon

(10) Patent No.: US 11,392,186 B2  
(45) Date of Patent: Jul. 19, 2022

(54) NOTEBOOK COMPUTER COOLER USING THERMOELECTRIC ELEMENT

(71) Applicant: ZALMAN TECH CO., LTD., Anyang-si (KR)

(72) Inventor: Kuk Young Yoon, Seoul (KR)

(73) Assignee: ZALMAN TECH CO., LTD., Anyang-si (KR)

( * ) Notice: Subject to any disclaimer, the term of this patent is extended or adjusted under 35 U.S.C. 154(b) by 0 days.

(21) Appl. No.: 17/514,238

(22) Filed: Oct. 29, 2021

(65) Prior Publication Data

US 2022/0050514 A1 Feb. 17, 2022

Related U.S. Application Data

(63) Continuation of application No. PCT/KR2019/017703, filed on Dec. 13, 2019.

(30) Foreign Application Priority Data

May 27, 2019 (KR) .......................... 10-2019-0061937

(51) Int. Cl.  
*G06F 1/20* (2006.01)  
*C09D 7/40* (2018.01)  
(Continued)

(52) U.S. Cl.  
CPC ............... *G06F 1/203* (2013.01); *C09D 5/24* (2013.01); *C09D 7/40* (2018.01); *H05K 7/205* (2013.01); *H05K 7/20172* (2013.01)

(58) Field of Classification Search  
CPC ..................................................... G06F 1/203  
See application file for complete search history.

(56) References Cited

U.S. PATENT DOCUMENTS 7,885,068 B2 * 2/2011 Seo .......................... G06F 1/203  
361/695

FOREIGN PATENT DOCUMENTS

JP 2004-326181 A 11/2004  
JP 2011-96989 A 5/2011  
(Continued)

OTHER PUBLICATIONS

International Search Report dated Mar. 27, 2020 in counterpart International Patent Application No. PCT/KR2019/017703 (2 pages in English and 2 pages in Korean).

(Continued)

*Primary Examiner* — William D Young  
(74) *Attorney, Agent, or Firm* — NSIP Law

(57) ABSTRACT

A notebook computer cooler using a thermoelectric element includes a housing, a base plate, as an top surface of the housing, having a thermal pad made of a thermally conductive material and on which a notebook computer is seated; a thermoelectric pad disposed in the housing such that a cooling surface thereof is in contact with an inner surface of the thermal pad; a fan disposed on a side opposite the cooling surface of the thermoelectric pad; and a plurality of vent holes penetrated through the base plate and a lower surface of the housing. According to the notebook computer cooler using a thermoelectric element, it is possible to provide an excellent cooling function of the notebook computer by efficiently absorbing the heat of the notebook computer through the thermal pad of a conductive material by using the heat absorption function of the thermoelectric element.

4 Claims, 5 Drawing Sheets

(51) Int. Cl.
*C09D 5/24* (2006.01)
*H05K 7/20* (2006.01)

(56) References Cited

FOREIGN PATENT DOCUMENTS

| | | |
|---|---|---|
| KR | 20-0397136 Y1 | 9/2005 |
| KR | 10-2007-0116446 A | 12/2007 |
| KR | 20-2009-0004698 U | 5/2009 |
| KR | 10-2011-0095661 A | 8/2011 |
| KR | 10-2012-0052605 A | 5/2012 |

OTHER PUBLICATIONS

Decision to Grant dated Feb. 20, 2020, in counterpart Korean Patent Application No. 10-2020-0000362 (1 page in English and 2 pages in Korean).

* cited by examiner

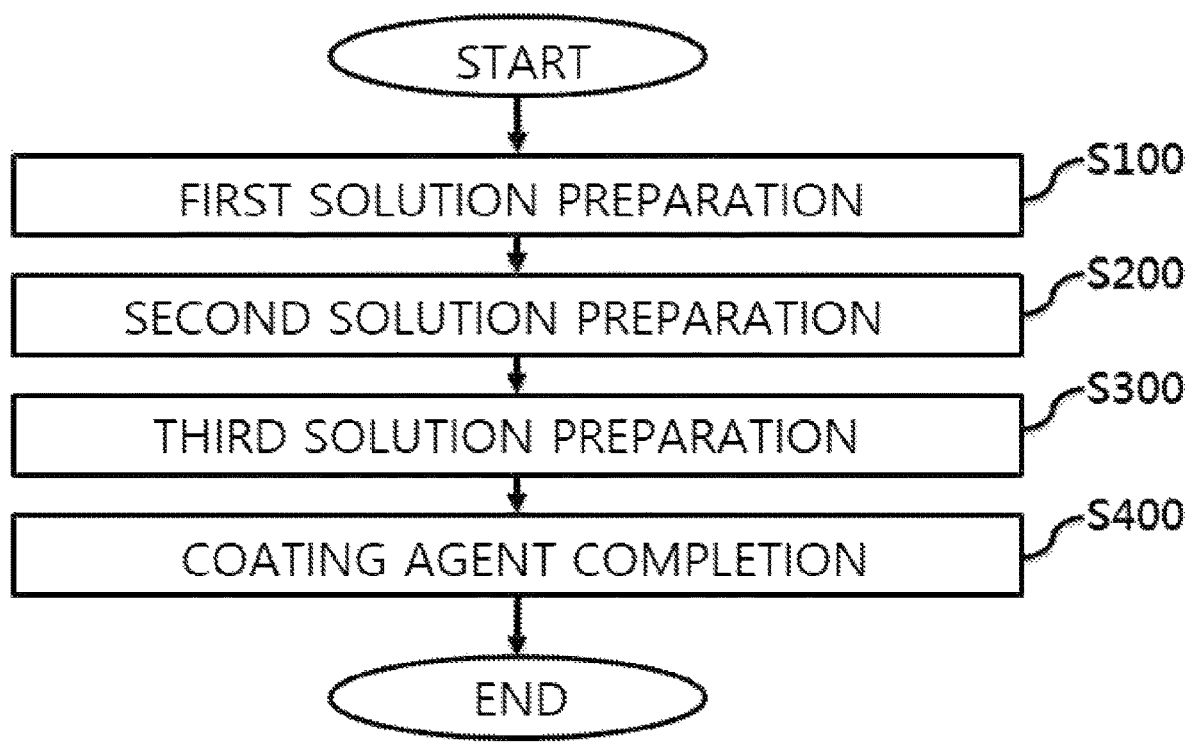

NOTEBOOK COMPUTER COOLER USING THERMOELECTRIC ELEMENT

CROSS-REFERENCE TO RELATED APPLICATIONS

Pursuant to 35 USC 120 and 365(c), this application is a continuation of International Application No. PCT/KR2019/017703 filed on Dec. 13, 2019, which claims the benefit under 35 USC 119(a) and 365(b) of Korean Patent Application No. 10-2019-0061937, filed on May 27, 2019 in the Korean Intellectual Property Office, the entire disclosure of which is incorporated herein by reference for all purposes.

BACKGROUND

1. Field

The present disclosure relates a notebook computer cooler using a thermoelectric element, and more particularly, to a notebook computer cooler able to absorb heat from a notebook computer using a heat absorbing function of a thermoelectric element, as well as cool the notebook computer more efficiently by conduction rather than convection using a conduction function of a thermal pad made of a thermally conductive material provided between the notebook computer and the thermoelectric element.

2. Description

With the development of portable computer technology, various types of electronic devices, such as notebook computer (or laptop) computers and tablet personal computers (PCs), are being released with enhanced portability due to being light weight. Although the thickness of the notebook computers with such enhanced portability is being reduced, the cooling of a central processing unit (CPU) or a graphic card still depends on a small fan disposed in the notebook computer.

These small fans have problems in that they may not sufficiently cool electronic components such as CPUs, and when used for a long time, some portions of the notebook computer may be heated to a hot level, and at the same time, noise may be generated by the rotation of the fan. In particular, the notebook computer fan is intended to dissipate heat from the notebook computer to the surroundings while causing convection by generating airflow. However, the heat may be disadvantageously trapped in the notebook computer since the notebook computer has insufficient surrounding space for a convection phenomenon to occur.

Korean Utility Model Publication No. 20-2017-0004289 proposes a technology for cooling a notebook computer by the rotation of a fan disposed on a heat sink seated on the notebook computer.

However, according to this technology, since a cooler is configured to be closely attached to the floor, the wind generated by the rotation of the fan may be trapped in the heat sink instead of circulating. Thus, the notebook computer may be indirectly cooled by convection, thereby causing a problem of low cooling efficiency.

Therefore, there is a need to develop a new, advanced notebook computer cooler that can directly absorb or cool the heat of the notebook computer by conduction rather than convection.

BRIEF SUMMARY

The present disclosure has been devised to overcome the problems of the above technology, and an objective of the present disclosure is to provide a notebook computer cooler that absorbs heat from a notebook computer using a thermoelectric element so as to cool the notebook computer more efficiently by conduction rather than convection using a thermal pad made of a thermally conductive material disposed between the notebook computer and the thermoelectric element.

Another objective of the present disclosure is to provide a thermal pad in protruded and inclined form, thereby efficiently absorbing and dissipating heat from a notebook computer seated thereon so that the heat is not absorbed to surrounding portions.

A further objective of the present disclosure is to provide a unique structure of heat pipes connecting a thermoelectric element pad and a fan so as to efficiently perform both a support function and a heat dissipation function of the thermoelectric element pad simultaneously.

A further objective of the present disclosure is to form a coating layer on the surface of a thermal pad by applying a coating agent containing 2-ethylhexyl acrylate thereon, thereby physically protecting the thermal pad and further improving the heat conduction efficiency of the thermal pad.

A further objective of the present disclosure is to provide a coating agent provided with a heat conductive coating agent including expanded graphite powder, thereby further improving both heat conduction efficiency and the mechanical strength and durability of the coating agent.

In order to realize at least one of the above objectives, there is provided a notebook computer cooler using a thermoelectric element, the cooler including: a housing; a base plate defining a top portion of the housing, and including a thermal pad made of a thermally conductive material, wherein a notebook computer is seated on the thermal pad; a thermoelectric pad disposed in the housing such that a cooling surface thereof is in contact with an inner surface of the thermal pad; a fan disposed on a side opposite the cooling surface of the thermoelectric pad; a plurality of vent holes penetrating through the base plate and a lower surface of the housing; and a coating layer provided on the surface of the thermal pad by applying a coating agent containing 2-ethylhexyl acrylate.

In addition, the surface of the thermal pad may include a coating layer formed by applying a coating agent containing 2-ethylhexyl acrylate.

In addition, the coating agent may be obtained by: a thermally conductive filler preparation step of preparing a thermally conductive filler by heating thermally conductive powder containing expanded graphite powder at 700 to 900° C. for 50 to 100 minutes in an argon (Ar) atmosphere; an epoxy composite preparation step of preparing an epoxy composite by mixing, by weight, 60 to 80 parts of a thermally conductive filler, 15 to 35 parts of epoxy, and 1 to 10 parts of a curing agent, based on a total weight of the epoxy composite; and a thermally conductive coating agent completion step of heating the epoxy composite at 70 to 90° C. for 10 to 30 minutes to complete a thermally conductive coating agent.

According to the notebook computer cooler using the thermoelectric element according to the present disclosure has the effects as follows:

1) It is possible to efficiently absorb heat from the notebook computer through the thermal pad made of a conductive material using the heat absorption function of the thermoelectric element, thereby providing an excellent cooling function of the notebook computer.

2) The problem of heat loss is minimized by causing the heat of the notebook computer to be concentrated to the thermal pad.

3) Stable support and efficient heat-dissipation of the thermoelectric element can be obtained by the heat pipes connecting the thermoelectric element and the fan in a unique manner.

4) It is possible to physically protect the thermal pad and further improve the heat conduction efficiency thereof by forming the coating layer on the surface of the thermal pad.

DESCRIPTION OF DRAWINGS

FIG. 5 is a flowchart illustrating a manufacturing process of a coating agent coated on the thermal pad according to the present disclosure.

DETAILED DESCRIPTION

Figure 1:
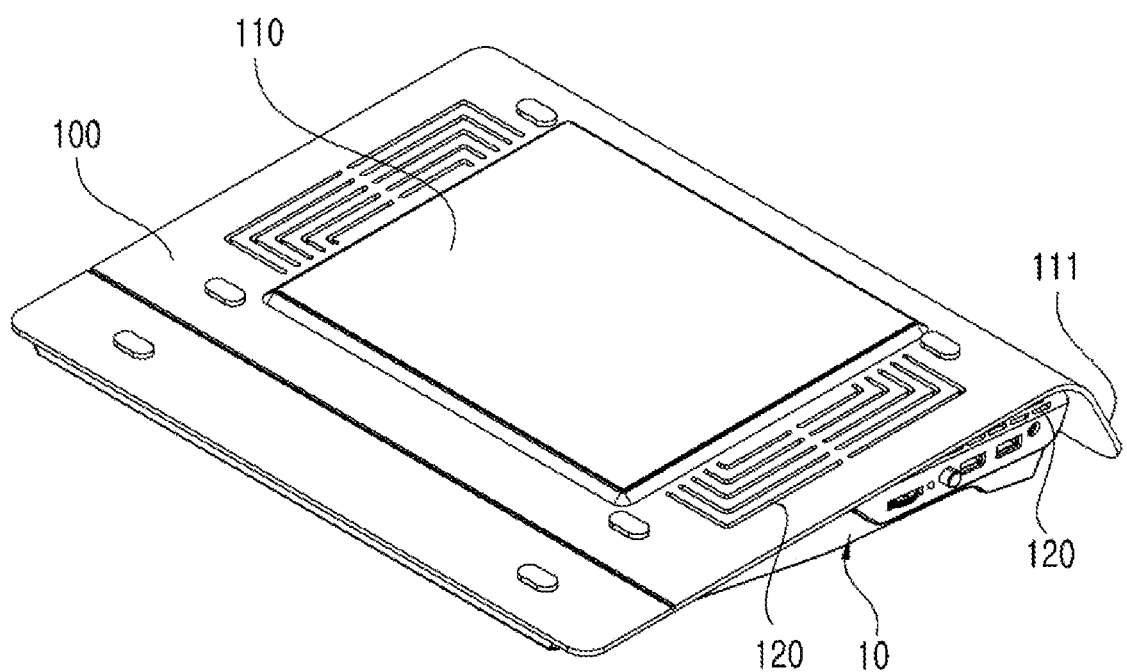
FIG. 1 is a top perspective view illustrating an external structure of a cooler according to the present disclosure.

Hereinafter, exemplary embodiments of the present disclosure will be described in detail with reference to the accompanying drawings. It should be understood that the accompanying drawings may not be drawn to scale, and like reference numerals may be used to refer to like elements throughout the drawings.

Figure 2:
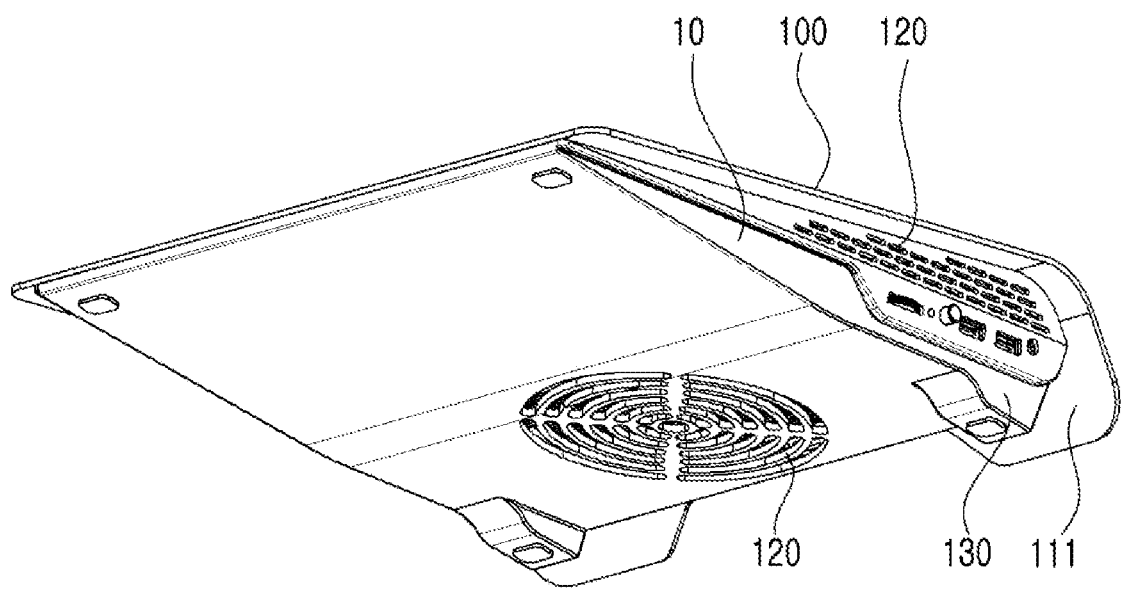
FIG. 2 is a bottom perspective view illustrating the external structure of the cooler according to the present disclosure.

FIG. 1 is a top perspective view illustrating an external structure of a cooler according to the present disclosure, and FIG. 2 is a bottom perspective view illustrating the external structure of the cooler according to the present disclosure As illustrated in FIGS. 1 and 2, the cooler according to the present disclosure is characterized by an appearance contoured by a housing 10 having a flat shape like a plate. A thermoelectric pad 200 is provided in the housing 10 to provide a cooling function by the thermoelectric element on the basis of conduction.

In the present disclosure, terms such as top and bottom appear frequently, and in each configuration, the "top" may be understood to refer to a side facing a notebook computer and the "bottom" may be understood to refer to the opposite side.

A notebook computer is seated on the top surface of the housing 10. Specifically, a thermal pad 110 is provided on the top surface area of the housing 10 on which the notebook computer is seated. At this time, in the present disclosure, the top surface of the housing 10 is referred to as a base plate 100.

The base plate 100 provides an area (specifically, a thermal pad) that seats and supports the notebook computer thereon while being in close contact with the bottom of the notebook computer. The top surface of the base plate 100 may extend horizontally in parallel to the floor, but as illustrated in FIGS. 1 and 2, it is preferable that the top surface extends to be inclined upwardly from the front to the rear, similarly to the known laptop holder. This is because such a configuration provides the convenience of the user's typing operation while improving the visibility of a notebook computer screen. In addition, the housing 10 may maintain an overall thin profile and provide a basis enabling an air discharge space, in which air discharged through the vent holes 120 smoothly circulates, to be formed in the bottom of the housing 10.

On one side of the surface of the base plate 100, preferably, on the central portion of the surface, the thermal pad 110 is disposed.

The thermal pad 110 is a pad, the area and shape of which correspond to the area of the bottom surface of the notebook computer made of a material with excellent thermal conductivity such as aluminum (Al). The bottom surface (or the back surface) of the thermal pad 110 is in contact with a cooling surface of a thermoelectric pad 200 to be described below to serve to efficiently transfer heat from the notebook computer to the cooling surface of the thermoelectric pad 200.

That is, the thermal pad 110 adopts a conduction method of directly absorbing heat from the notebook computer, rather than a conventional method of indirectly cooling a cooling target such as a notebook computer using a conventional fan on the basis of a convection phenomenon. Thus, the thermal pad 110 may provide a cooling function superior to the cooling function by convection.

In particular, the thermal pad 110 of the present disclosure may be configured such that the thermal pad protrudes to a certain level (e.g., 3 to 10 mm) from the surface of the base plate 100. Each side surface (of four side surfaces in FIG. 1) has an inclined standing structure, i.e., a narrow-top and wide-bottom structure, with the width thereof decreasing in the bottom to top direction.

That is, the protrusion of the thermal pad 110 made of a thermally conductive material from the base plate 100 prevents the cold heat (or cold energy) generated from the cooling surface of the thermoelectric pad 200 from being dispersed into the base plate 100 that may not be made of a thermally conductive material or interfering with the base plate 100, but allows the cold heat to be further concentrated on the thermal pad 110. At the same time, the inclined structure with the narrow-top and wide-bottom form in the thermal pad is designed to allow the cold heat to be concentrated on the surface portion of the thermal pad 110 while preventing dispersion or diffusion of the cold heat into air.

A plurality of vent holes 120 having a specific pattern are formed in the periphery of the base plate 100, on which the thermal pad 110 is provided, to penetrate into the housing 10.

The vent holes 120 on the thermal pad 110 side serve to transfer the cold heat of the thermoelectric pad 200 to the bottom of the notebook computer.

The vent holes 120 may be formed in various other positions of the housing 10. As illustrated in FIGS. 1 and 2, the plurality of vent holes 120 having a specific pattern may also be formed in the sides and the bottom of the housing to penetrate therethrough. In particular, the vent holes 120 in the sides and the bottom of the housing 10 intensively serve to dissipate the heat of the notebook computer and the thermoelectric pad 200 to the outside.

Additionally, referring to FIGS. 1 and 2, the housing 10 includes a wing panel 111 provided on the rear side of the base plate 100 and extending obliquely downward toward the rear outside while surrounding the rear side of the housing 10. In addition, a leg 130 having a predetermined height may be provided on a portion of the bottom of the housing 10 around the wing panel 111.

The wing panel 111 may be a portion formed by additionally extending the rear end of the base plate 100. The wing panel 111 takes a structure extending to the bottom while enclosing the rear side of the housing 10. As a result, the wing panel serves as a windshield to allow the air discharged from the bottom surface of the housing 10 to flow toward the rear side of the housing 10 so as to prevent the air from being dispersed indiscriminately.

On the other hand, the leg 130 is disposed upright on the bottom of the housing 10, specifically on the bottom on the rear side of the housing 10 around the wing panel 111, such that the bottom of the housing 10 does not completely reach the floor so that a certain space, i.e., an air space, is obtained between the bottom of the housing 10 and the floor, thereby preventing the air discharged through the vent holes 120 from being trapped.

In particular, in this air space, since the rear side of the housing 10 is blocked by the wing panel 111 so that an air path is formed only in the left and right directions of the housing 10, the air discharged through the bottom of the housing 10 moves by convection or flows stably along the extension direction of the air space. That is, this serves to minimize the problem of degradations in the efficiency of air heat in which air is not stably flow-controlled in one direction and is discharged in all directions.

Figure 3:
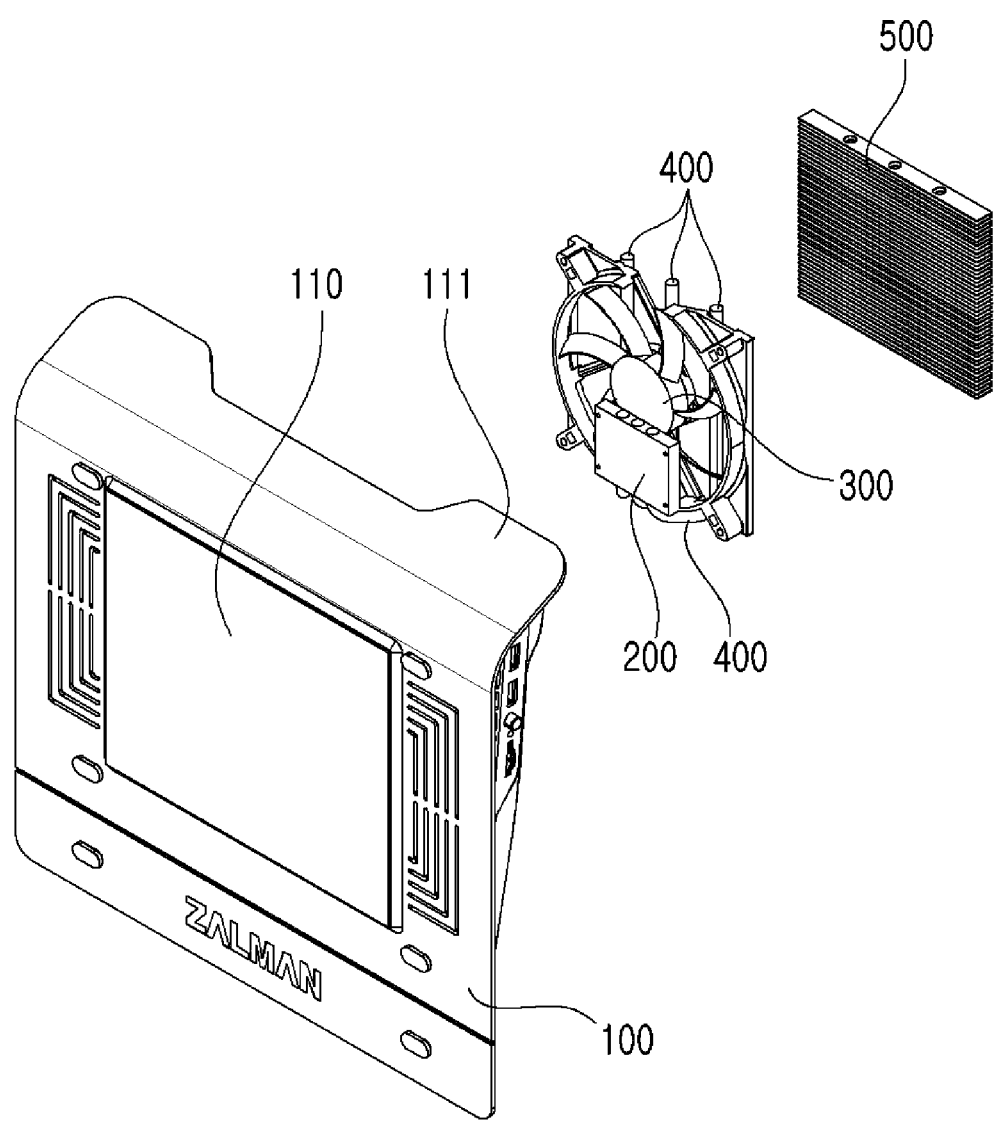
FIG. 3 is a top exploded perspective view illustrating the cooler according to the present disclosure.
Figure 4:
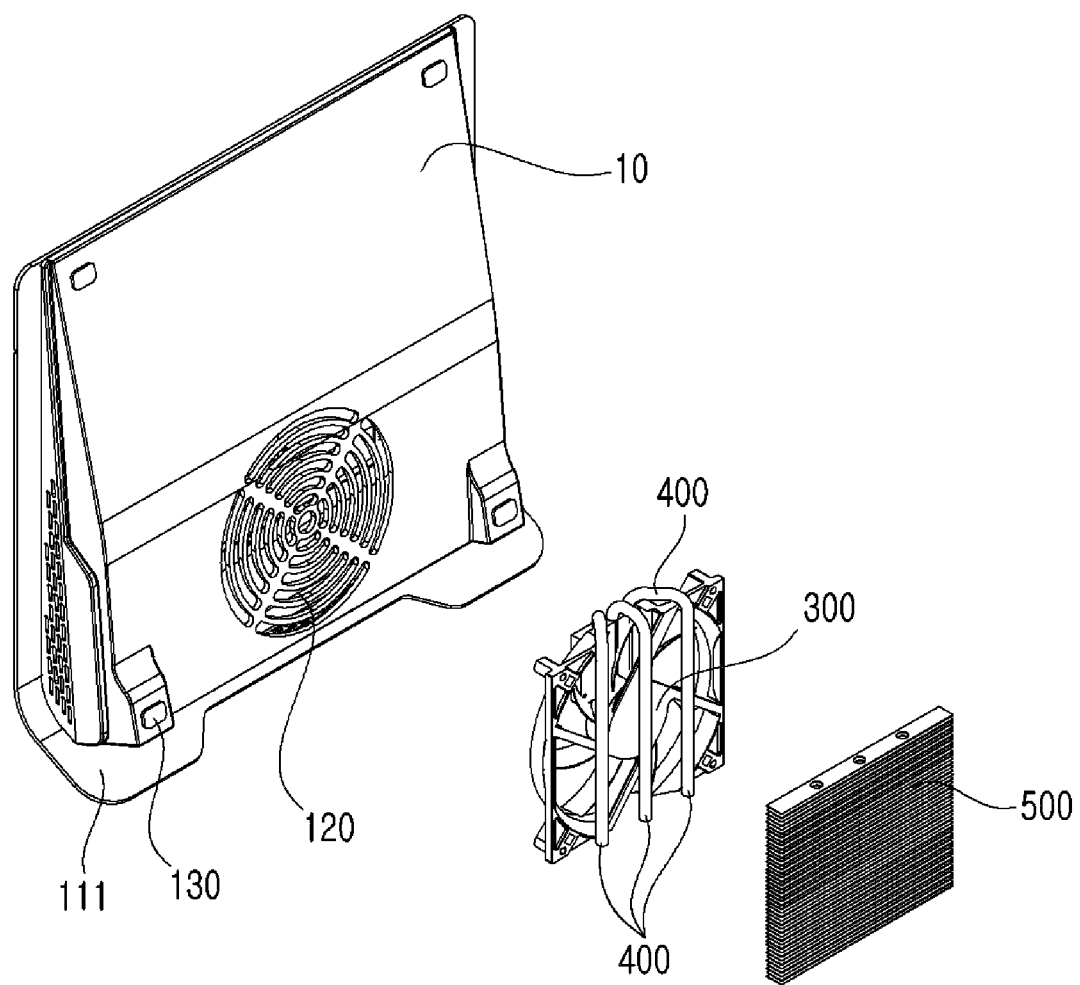
FIG. 4 is a bottom exploded perspective view illustrating the cooler according to the present disclosure.

FIG. 3 is a top exploded perspective view illustrating the cooler according to the present disclosure, and FIG. 4 is a bottom exploded perspective view of the cooler according to the present disclosure.

As illustrated in FIGS. 3 and 4, the thermoelectric pad 200 literally refers to a plate-shaped body or panel structure composed of a thermoelectric element having a top surface that is a surface facing the thermal pad 110 and a bottom surface opposite the upper surface. The thermoelectric pad provides the unique function of a thermoelectric element, i.e., to generate heat and absorb heat through electricity generation.

That is, when one side of the thermoelectric element generates heat in response to electricity supplied thereto, the opposite side absorbs heat by the Peltier effect. Using this principle of the thermoelectric element, the thermoelectric element is accordingly configured such that the top surface (i.e., a cooling surface) of the thermoelectric pad 200 provides a heat-absorbing function and the bottom surface of the thermoelectric pad 200 provides a heat-generating function.

A thermoelectric element is a device generating thermoelectric power by a temperature difference on the basis of the supplied power. The thermoelectric element may use a currently known thermoelectric material, such as either a thermoelectric material using the Seebeck effect or a Peltier element (i.e., a thermoelectric material), or otherwise other thermoelectric elements of currently known materials.

Although not illustrated in the drawings, such a thermoelectric element (i.e., the thermoelectric pad in the present disclosure) may generally include a heating substrate, a cooling substrate, and a thermoelectric material. The top surface of the thermoelectric pad 200 serves as the cooling substrate, i.e., a cooling surface, and the bottom surface serves as the heating substrate, i.e., the opposite surface of the cooling surface. The principle and function of the thermoelectric element may refer to those of a conventional thermoelectric element, so a more detailed description thereof will be omitted.

The top surface of the thermoelectric pad 200, i.e., the cooling surface, is in contact with an inner surface (i.e., the bottom surface) of the thermal pad 110 to absorb the heat of the notebook computer by the conduction function of the thermal pad 200 or transfer the cold heat of the cooling surface of the thermoelectric pad 200 to the notebook computer through the thermal pad 110.

In addition, although not shown in the drawings, a power supply for supplying power to the thermoelectric pad 200 by receiving power from an internal source or an external source is provided inside the housing 10. This power supply also serves to drive a fan 300.

The fan 300 is in contact with the bottom surface, i.e., the heating surface, of the thermoelectric pad 200, so as to send air toward the bottom of the housing 10. Accordingly, heat generated on the opposite side of the cooling surface of the thermoelectric pad 200 may be efficiently discharged to the outside. At this time, the fan 300 is disposed below the thermoelectric pad 200 in the housing 10 so as to seat and contact the bottom surface (heating surface) of the thermoelectric pad 200.

At this time, in order to more efficiently discharge the heat generated by the thermoelectric pad 200 to the outside following the rotation of the fan 300, the thermoelectric pad 200 needs to be stably supported on the top side of the fan 300. A separate support structure may be required for this purpose.

Specifically, the cooler of the present disclosure further includes a plurality of heat pipes 400 that start extending from one side of the thermoelectric pad 200, are bent at a portion past the side of the fan 300, and then extend to the bottom of the fan 300 in the housing 10 such that they surround a portion of the fan 300.

Like a known cooling device, the heat pipe 400 made of a thermally conductive material such as copper serves to absorb and conduct heat to discharge or dissipate the heat in the extension direction, and the heat pipe is connected to a side of the thermoelectric pad 200 while surrounding the bottom and the side of the fan 300, so as to transfer the heat generated from the heating surface of the thermoelectric pad 200 in the direction of the fan 300 while stably supporting the thermoelectric pad 200 on the top side of the fan 300 and maximizing the contact area.

Furthermore, the plurality of heat pipes 400 may have a structure in which the heat pipes 400 located on both sides of the central heat pipe 400 first extend along the side of the fan 300 such that the heat pipes are spread apart from each other, are bent at a boundary portion between the side and the bottom surface of the fan 300 to reach the bottom surface of the fan 300, and then extend parallel to each other along the bottom surface of the fan 300.

Specifically, the heat pipes 400 may be designed such that the top sides of the heat pipes 400, i.e., the connection portions with the thermoelectric pad 200, extend in a mutually spread-out direction to prevent mutual heat transfer or thermal interference as most as possible. On the bottom of the fan 300, the heat pipes 400 may extend parallel to each other at a predetermined distance from each other to provide a stable coupling relationship with the fan 300 as well as to ensure a stable supporting function of the thermoelectric pad 200.

In addition, the cooler of the present disclosure may further include a heat dissipation plate 500 on which portions of the heat pipes 400 that extend in parallel from the bottom surface of the fan 300 are seated.

This heat dissipation plate 500 has the same or similar panel structure as a known heat dissipation plate, thereby providing a function of further cooling the heat discharged toward the bottom of the housing 10 by the rotation of the fan 300 on the basis of an excellent surface area contact function.

The bottom of the housing 10 is located on the bottom side of the heat dissipation plate 500, and as mentioned above, vent holes 120 are formed through the bottom of the housing 10 such that internal heat of the housing 10 may be discharged through the vent holes 120 in the bottom (or a side) of the housing 10 by the rotation of the fan.

The cooling process of the notebook computer according to the cooler configuration of the present disclosure will be described in brief as follows.

When a power supply is activated with the manipulation of a switch disposed on one side of the side of the housing 10, the heating surface of the thermoelectric pad 200 supplied with power is heated, and at the same time, the opposite surface, i.e., the cooling surface, is cooled.

This cooling surface is in contact with the inner surface (i.e., the bottom) of the thermal pad 110 to absorb the heat of the notebook computer seated on the thermal pad 110 or to conduct the cold heat of the thermoelectric pad 200 toward the bottom of the notebook computer to cool the notebook computer according to the heat conduction function of the thermal pad 110.

On the other hand, the so-called heating surface, which is the opposite side of the cooling surface of the thermoelectric pad 200, is heated, and through the rotation of the fan 300, the heat is discharged to the outside through the vent holes 120 on the bottom side of the housing 10. At this time, the discharged air is stably discharged along a type of convection path through the air space opened to both sides of the housing 10 by the leg 130 and the wing panel 111.

In particular, the thermoelectric pad 200 is stably disposed between the fan 300 and the bottom surface of the thermal pad 110 in a state in which they are in contact with each other by the heat pipe 400 having the above-described unique structure, so that heat of the thermoelectric pad 200 may be smoothly transferred toward the bottom of the housing 10 by the heat conduction function along with the rotation of the fan 300.

As such, the present disclosure provides a characteristic of realizing excellent and efficient cooling of the notebook computer by performing direct cooling on the bottom of the notebook computer on the basis of the conduction phenomenon.

FIG. 5 is a flow chart illustrating a process of forming a coating layer coated on a thermal pad of the present disclosure.

In addition, the surface of the thermal pad 110 may be coated with a coating agent containing 2-ethylhexyl acrylate and then subjected to UV light curing to form a coating layer. At this time, the coating layer is applied to the surface of the thermal pad 110 to physically protect the thermal pad 110 and at the same time, due to its high thermal conductivity, the coating layer may further improve the thermal conductivity of the thermal pad 110.

As illustrated in FIG. 5, the coating agent may be prepared through a first solution preparation step S100, a second solution preparation step S200, a third solution preparation step S300, and a coating agent completion step S400.

In particular, when providing a coating agent in this way, the present disclosure may include a step of assembling the above-described configuration of the notebook computer cooler and a step of applying the coating agent to the surface of the thermal pad 110 to form a coating layer.

First, the first solution preparation step S100 is a process of preparing a first solution by mixing, by weight, 60 to 75 parts of 2-ethylhexyl acrylate and 25 to 40 parts of butyl acrylate, based on the total weight of the first solution.

Here, 2-ethylhexyl acrylate and butyl acrylate serve as a monomer to be polymerized into a coating agent through a process to be described below, i.e., a material of the coating agent. At this time, 2-ethylhexyl acrylate serves as a main monomer, and butyl acrylate serves as an auxiliary monomer.

Subsequently, the second solution preparation step S200 is a process of preparing a second solution by mixing, by weight, 95 to 99 parts of the first solution and 1 to 5 parts of the photoinitiator, based on the total weight of the second solution, and then exposing the mixture to UV irradiation for 20 to 30 minutes. It is preferred that this step is performed by stirring in a state in which exposure to light is blocked. At this time, the two monomers are polymerized through the UV irradiation process to form an oligomer (a polymer produced by polymerization of a low degree of monomer), and the photoinitiator may use 1-Hydroxy-cyclohexylphenyl-ketone, etc. which serves to initiate a polymerization reaction through UV absorption.

Then, the third solution preparation step S300 is a process of preparing a third solution by mixing, by weight, 85 to 95 parts of the second solution, 1 to 10 parts of graphite powder, 1 to 10 parts of benzoyl peroxide (BPO), 0.1 to 1 parts of 1,6 hexanediol diacrylate (HDDK), and 0.5 to 5 parts of amine, based on the total third solution weight, in a nitrogen atmosphere.

Here, as one of the allotropes of carbon, graphite was used as a filler for improving the thermal conductivity of the coating agent in this process. In addition, benzoyl peroxide and amine may serve as a thermal initiator in this process, and 1,6-hexanediol diacrylate may serve as a curing agent for curing the coating agent. In this case, amine may be N,Ndimethylaniline, diethylamine, N,N-dimethyl-p-toluidine, Di-n-hexylamine, or p-Phenylenediamine.

Finally, the coating agent completion step S400 is a process of completing a coating agent by mixing, by weight, 85 to 95 parts of the third solution and 5 to 15 parts of the thermal conductive coating agent, based on the total weight of the coating agent. In this case, the thermal conductive coating agent is an auxiliary material capable of further improving thermal conductivity, together with the above-described graphite of the coating agent. A specific forming process thereof will be described below.

The coating agent prepared through this process is applied to the surface of the thermal pad to form a coating layer, thereby assisting the thermal conductivity of the thermal pad and at the same time protecting the aluminum thermal pad from physical damage such as scratches.

Additionally, the above-described thermally conductive coating agent may be prepared through a thermally conductive filler preparation step, an epoxy composite preparation step, and a thermally conductive coating agent completion step.

First, the thermally conductive filler preparation step is a process of preparing a thermally conductive filler by heating thermally conductive powder containing expanded graphite powder at 700 to 900° C. for 50 to 100 minutes in an argon (Ar) atmosphere. In this process, the heating process may be performed by first supplying hydrogen gas ($H_2$), together with argon gas, for 30 to 50 minutes, and second supplying ethyne gas ($C_2H_2$) for 10 to 30 minutes. Here, the thermally conductive powder is a material that contains expanded graphite powder and has excellent thermal conduction efficiency and thus serves as a main material for the thermally conductive coating agent. A specific manufacturing method thereof will be described below. After this process, it is desirable to reduce the temperature of the thermally conductive filler to a temperature of about room temperature (about 20 to 25° C.), so that the volume of the thermally conductive powder grows.

Subsequently, the epoxy composite preparation step is a process of preparing an epoxy composite by mixing, by weight, 60 to 80 parts of a thermally conductive filler, 15 to 35 parts, of epoxy, and 1 to 10 parts, of a curing agent, based on the total weight of the epoxy composite. Here, the epoxy may use a commercially available BPA-Novolac-type epoxy resin as a base material for a thermally conductive coating agent, and is a material having excellent mechanical, electrical, and chemical properties. In addition, the curing agent serves to improve the viscosity of the thermally conductive filler, and may use phthalic acid anhydride, diethyl amino propylamine, etc.

Finally, the thermally conductive coating agent completion step is a process of heating the epoxy composite at 70 to 90° C. for 10 to 30 minutes to complete a thermally conductive coating agent.

The thermally conductive coating agent prepared through this process is contained as a component of the coating agent to further improve the thermal conduction efficiency of the coating agent, and may also help to improve the durability and mechanical performance of the coating agent.

As set forth above, the configuration and operation of the notebook computer cooler using a thermoelectric element according to the present disclosure have been expressed in the description and illustrated in the drawings, merely by way of example. The scope of the present disclosure is not limited to the description and drawings, and may be variously changed and modified without departing from the technical idea of the present disclosure.

DESCRIPTION OF REFERENCE NUMERALS

10: housing
100: base plate
111: wing panel
110: thermal pad
120: vent hole
130: leg
200: thermoelectric pad
300: fan
400: heat pipe
500: heat dissipation plate
S100: first solution preparation step
S200: second solution preparation step
S300: third solution preparation step
S400: coating agent completion step

What is claimed is:

1. A notebook computer cooler using a thermoelectric element, the cooler comprising:
   a housing;
   a base plate defining a top portion of the housing, and comprising a thermal pad made of a thermally conductive material, wherein a notebook computer is seated on the thermal pad;
   a thermoelectric pad disposed in the housing such that a cooling surface thereof is in contact with an inner surface of the thermal pad;
   a fan disposed on a side opposite the cooling surface of the thermoelectric pad;
   a plurality of vent holes penetrating through the base plate and a lower surface of the housing; and
   a coating layer provided on the surface of the thermal pad by applying a coating agent containing 2-ethylhexyl acrylate,
   wherein the coating agent is obtained by:
   a first solution preparation step of preparing a first solution by mixing, by weight, 60 to 75 parts of 2-ethylhexyl acrylate and 25 to 40 parts, of butyl acrylate, based on a total weight of the first solution;
   a second solution preparation step of preparing a second solution by mixing, by weight, 95 to 99 parts of the first solution and 1 to 5 parts of a photoinitiator, based on a total weight of the second solution, and then exposing the mixture to UV for 20 to 30 minutes;
   a third solution preparation step of preparing a third solution by mixing, by weight, 85 to 95 parts of the second solution, 1 to 10 parts of graphite powder, 1 to 10 parts of benzoyl peroxide (BPO), 0.1 to 1 part of 1,6 hexanediol diacrylate (HDDK), and 0.5 to 5 parts of amine, based on a total weight of the third solution, in a nitrogen atmosphere; and
   a step of completing the coating agent by mixing, by weight, 85 to 95 parts of the third solution and 5 to 15 parts of a thermally conductive coating agent, based on a total weight of the coating agent.

2. The notebook computer cooler according to claim 1, wherein the thermal pad protrudes from a surface of the base plate, with a side thereof being obliquely upright in a narrow-top and wide-bottom structure.

3. The notebook computer cooler according to claim 1, wherein the notebook computer cooler comprises a plurality of heat pipes extending from a side of the thermoelectric pad and bent to side and bottom surfaces of the fan to surround a portion of the fan, such that the heat pipe serves to support the thermoelectric pad and dissipate heat of the thermoelectric pad.

4. The notebook computer cooler according to claim 1, wherein the thermally conductive coating agent is obtained by:
   a thermally conductive filler preparation step of preparing a thermally conductive filler by heating thermally conductive powder containing expanded graphite powder at 700 to 900° C. for 50 to 100 minutes in an argon (Ar) atmosphere;
   an epoxy composite preparation step of preparing an epoxy composite by mixing, by weight, 60 to 80 parts of a thermally conductive filler, 15 to 35 parts of epoxy, and 1 to 10 parts of a curing agent, based on a total weight of the epoxy composite; and
   a thermally conductive coating agent completion step of heating the epoxy composite at 70 to 90° C. for 10 to 30 minutes to complete a thermally conductive coating agent.

* * * * *